United States Patent
Kim et al.

(10) Patent No.: US 10,784,564 B2
(45) Date of Patent: *Sep. 22, 2020

(54) ANTENNA-INTEGRATED RADIO FREQUENCY MODULE

(71) Applicant: Samsung Electro-Mechanics Co., Ltd., Suwon-si (KR)

(72) Inventors: Hong In Kim, Suwon-si (KR); Thomas A. Kim, Suwon-si (KR); Ho Kyung Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/694,228

(22) Filed: Nov. 25, 2019

(65) Prior Publication Data

US 2020/0091585 A1    Mar. 19, 2020

Related U.S. Application Data

(63) Continuation of application No. 16/503,666, filed on Jul. 5, 2019, which is a continuation of application No. 15/817,329, filed on Nov. 20, 2017, now Pat. No. 10,396,432.

(30) Foreign Application Priority Data

Jan. 23, 2017  (KR) .................. 10-2017-0010490
Jun. 7, 2017   (KR) .................. 10-2017-0070621

(51) Int. Cl.
*H01Q 1/38* (2006.01)
*H01Q 1/22* (2006.01)
(Continued)

(52) U.S. Cl.
CPC .......... *H01Q 1/2283* (2013.01); *H01L 23/66* (2013.01); *H01Q 1/48* (2013.01); *H01Q 21/065* (2013.01);
(Continued)

(58) Field of Classification Search
CPC ...... H01Q 1/2283; H01Q 1/48; H01Q 21/065; H05K 1/00; H01L 23/66; H01L 2223/6677
(Continued)

(56) References Cited

U.S. PATENT DOCUMENTS 6,853,334 B2*  2/2005  Imai .................. H01Q 1/247
                                                    333/26
8,797,117 B2*  8/2014  Shimakawa ......... H03H 7/0115
                                                    333/25
(Continued)

FOREIGN PATENT DOCUMENTS

CN   104577316 A   4/2015
CN   105990652 A   10/2016
(Continued)

OTHER PUBLICATIONS

United States Office Action dated Feb. 14, 2020 in related U.S. Appl. No. 16/503,666 (11 pages in English).
(Continued)

*Primary Examiner* — Jean B Jeanglaude
(74) *Attorney, Agent, or Firm* — NSIP Law

(57) ABSTRACT

An antenna-integrated radio frequency (RF) module includes a multilayer substrate disposed between an integrated chip (IC) and patch antennas, signal vias, and ground members. The IC is configured to generate RF signals. The signal vias are configured to connect and transmit/receive the RF signals from each of the patch antennas to the IC. The ground members are disposed on an outer surface layer and intermediate surface layers of the multilayer substrate to surround each of the patch antennas and the signal vias.

21 Claims, 12 Drawing Sheets

(51) Int. Cl.
   *H01L 23/66* (2006.01)
   *H01Q 1/48* (2006.01)
   *H01Q 21/06* (2006.01)
   *H05K 1/02* (2006.01)
   *H05K 1/16* (2006.01)

(52) U.S. Cl.
   CPC ........... *H05K 1/0228* (2013.01); *H05K 1/165* (2013.01); *H01L 2223/6677* (2013.01); *H05K 2201/10098* (2013.01)

(58) Field of Classification Search
   USPC .................................................. 343/700 MS
   See application file for complete search history.

(56) References Cited

U.S. PATENT DOCUMENTS

| | | | |
|---|---|---|---|
| 9,660,340 | B2 | 5/2017 | Yokoyama et al. |
| 2008/0191956 | A1 | 8/2008 | Watanabe |
| 2011/0181484 | A1 | 7/2011 | Pettus et al. |
| 2011/0221652 | A1 | 9/2011 | Li et al. |
| 2014/0138804 | A1* | 5/2014 | Takizawa ................ H01L 23/66 257/664 |
| 2014/0287701 | A1 | 9/2014 | Herbsommer et al. |
| 2014/0376201 | A1 | 12/2014 | Niemann et al. |
| 2015/0194730 | A1 | 7/2015 | Sudo et al. |
| 2016/0276734 | A1 | 9/2016 | Jin et al. |
| 2017/0344876 | A1 | 11/2017 | Brothers |

FOREIGN PATENT DOCUMENTS

| | | |
|---|---|---|
| EP | 2 919 323 A1 | 9/2015 |
| KR | 10-2009-0038588 A | 4/2009 |
| WO | WO 2014/073355 A1 | 5/2014 |

OTHER PUBLICATIONS

Chinese Office Action dated Nov. 12, 2019 in corresponding Chinese Patent Application No. 201810039489.1 (14 pages in English, 9 pages in Chinese).

* cited by examiner

ANTENNA-INTEGRATED RADIO FREQUENCY MODULE

CROSS-REFERENCE TO RELATED APPLICATION(S)

This application is a continuation of U.S. patent application Ser. No. 16/503,666 filed on Jul. 5, 2019, which is a continuation of U.S. patent application Ser. No. 15/817,329 filed on Nov. 20, 2017, now U.S. Pat. No. 10,396,432 issued on Aug. 27, 2019, which claims benefit under 35 USC 119(a) of Korean Patent Application Nos. 10-2017-0010490 filed on Jan. 23, 2017, and 10-2017-0070621 filed on Jun. 7, 2017, in the Korean Intellectual Property Office, the entire disclosures of which are incorporated herein by reference for all purposes.

BACKGROUND

1. Field

The present disclosure relates to an antenna-integrated radio frequency (RF) module.

2. Description of Related Art

In recent years, millimeter wave (mmWave) communications, including 5th generation communications, have been actively researched, and research into the commercialization of a radio frequency (RF) module able to smoothly implement millimeter wave communications has also been actively conducted.

Miniaturization of RF modules is necessary for the commercialization of the RF module, but may cause deterioration in radiation characteristics and signal transmission efficiency of an antenna. Such a phenomenon may occur significantly in an RF module using a high frequency RF signal such as a signal used for 5th generation communications or millimeter wave communications.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general embodiment, an antenna-integrated radio frequency (RF) module includes a multilayer substrate, an integrated chip (IC), patch antennas, a first ground member, a second ground member, and a third ground member. The integrated chip (IC) is disposed on an outer surface of the multilayer substrate, and configured to generate RF signals. The patch antennas are disposed on a first layer of the multilayer substrate, and configured to receive and/or transmit the RF signals from signal vias disposed to penetrate through second and third layers of the multilayer substrate. The first ground member is disposed on the first layer, and configured to have first penetration regions surround each of the patch antennas. The second ground member disposed on the second layer, and configured to have second penetration regions surrounding each of the signal vias. The third ground member is disposed on the third layer, and configured to have third penetration regions surrounding each of the signal vias. Each of the first and second penetration regions is larger than each of the patch antennas, each of the third penetration regions is smaller than each of the patch antennas. The first, second, and third layers of the multilayer substrate are sequentially disposed.

The first ground member may include a first ground via group disposed to surround each of the first penetration regions, and the second ground member may include a second ground via group disposed to surround each of the second penetration regions.

The third ground member may include a third ground via group disposed at a position corresponding to a position of the second ground via group.

The antenna-integrated RF module may further include a second-second ground member disposed between the second ground member and the first ground member, and configured to have a form similar to the second ground member.

A fourth layer and a fifth layer of the multilayer substrate may be disposed between the third layer and the IC. The second signal vias may be disposed to penetrate through the fifth layer, and configured to receive the RF signals from the IC. RF lines may be disposed on the fourth layer, and configured to receive the RF signals from the second signal vias.

A fourth ground member may be disposed on the fourth layer, and configured to have fourth penetration regions surrounding each of the RF lines. The fourth ground member may include a fourth ground via group disposed to surround each of the fourth penetration regions. The third ground member may include a third ground via group disposed at a position corresponding to a position of the fourth ground via group.

A fifth ground member may be disposed on the fifth layer, and configured to surround each of the second signal vias. A power ground member may be disposed on the fifth layer, and surrounded by the fifth ground member. The power ground member may be connected to the IC.

A sixth layer and a seventh layer may be disposed between the fifth layer and the IC. An analog line may be disposed on the sixth layer, a first analog ground member may be disposed on the fifth layer at a position corresponding to a position of the analog line, and a sixth ground member may be disposed on the sixth layer to surround the analog line. A second analog ground member may be disposed on the seventh layer at a position corresponding to the position of the analog line. An analog via may electrically connect the analog line and the IC to each other.

The patch antennas may include sixteen patch antennas disposed in a 4×4 matrix and each having a similar form as the other, and the signal vias may include thirty-two signal vias with each patch antenna having two second signal vias.

When some among the patch antennas are rotated by 90° or 180°, a connection point to the signal via of each of the patch antennas may be the same as other patch antennas.

The antenna-integrated RF module may further include a sub-substrate disposed on the surface of the multilayer substrate to surround the IC. The sub-substrate includes solder balls electrically connecting between the IC and the sub-substrate.

The antenna-integrated RF module may further include a passive element disposed between the sub-substrate and the IC, wherein the surface of the multilayer substrate has a first trench disposed to surround the IC, and a second trench disposed to surround the first trench and surrounded by the sub-substrate.

The IC may convert signals received through the solder balls into the RF signals of a millimeter wave (mmWave) band.

In another general aspect, an antenna-integrated radio frequency (RF) module includes a multilayer substrate disposed between an integrated chip (IC) and patch antennas, signal vias, and ground members. The IC is configured to generate RF signals. The signal vias are configured to connect and transmit/receive the RF signals from each of the patch antennas to the IC. The ground members are disposed on an outer surface layer and intermediate surface layers of the multilayer substrate to surround each of the patch antennas and the signal vias.

The patch antennas may be disposed on a first layer of the multilayer substrate opposite the outer surface where the IC is disposed.

A first ground member of the ground members may be disposed on the first layer, and configured to have first penetration regions surround each of the patch antennas. A second ground member of the ground members may be disposed on a second layer of the multilayer substrate, and configured to have second penetration regions surrounding each of the signal vias. A third ground member of the ground members may be disposed on the third layer of the multilayer substrate, and configured to have third penetration regions surrounding each of the signal vias.

Each of the first and second penetration regions may be larger than each of the patch antennas. Each of the third penetration regions may be smaller than each of the patch antennas.

The IC and patch antennas may be configured to transmit/receive the RF signals of a millimeter wave (mmWave) band.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
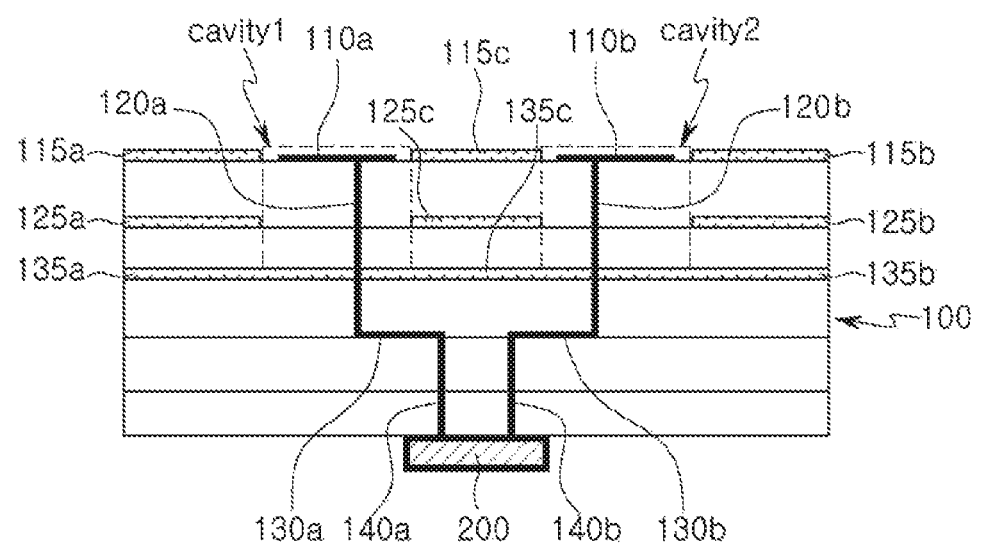
FIG. 1 is a view illustrating an antenna-integrated RF module according to an example in the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an antenna-integrated RF module according to an example in the present disclosure.

Referring to FIG. 1, an antenna-integrated RF module according to an example in the present disclosure includes at least a portion of a substrate 100 and an integrated chip (IC) 200. The substrate 100 includes a plurality of patch antennas 110a and 110b, first ground members 115a, 115b, and 115c, a plurality of first signal vias 120a and 120b, second ground members 125a, 125b, and 125c, a plurality of RF lines 130a and 130b, third ground members 135a, 135b, and 135c, and a plurality of second signal vias 140a and 140b.

The plurality of patch antennas 110a and 110b radiate RF signals generated from the IC 200, and may receive an external RF signal.

The first ground members 115a, 115b, and 115c have a plurality of first penetration regions surrounding each of the plurality of patch antennas 110a and 110b.

The plurality of first signal vias 120a and 120b transmit the RF signals to the plurality of patch antennas 110a and 110b or receive the RF signals from the plurality of patch antennas 110a and 110b.

The second ground members 125a, 125b, and 125c have a plurality of second penetration regions surrounding each of the plurality of first signal vias 120a and 120b.

The plurality of RF lines 130a and 130b transmit or receive RF signals from the plurality of first signal vias 120a and 120b.

The third ground members 135a, 135b, and 135c have a plurality of third penetration regions surrounding each of the plurality of first signal vias 120a and 120b.

The plurality of second signal vias 140a and 140b electrically connect the plurality RF lines 130a and 130b and the IC 200 to transmit the RF signals.

Here, each of the plurality of first penetration regions and the plurality of second penetration regions are larger than each of the plurality of patch antennas. Each of the plurality of third penetration regions are smaller than each of the plurality of patch antennas 110a and 110b.

Accordingly, a plurality of cavities cavity1 and cavity2 is disposed between the plurality of patch antennas 110a and 110b and the third ground members 135a, 135b, and 135c. The plurality of cavities cavity1 and cavity2 improves radiation characteristics (e.g., gain, loss, and directivity) of the plurality of patch antennas 110a and 110b, and also reduces loss and interference of the plurality of RF lines 130a and 130b and the plurality of second signal vias 140a and 140b. Therefore, the antenna-integrated RF module prevents deterioration in radiation characteristics and signal transmission efficiency of the antenna that may be due to a reduction in size when integrating an operating environment from the IC 200 with the plurality of patch antennas 110a and 110b.

In one example, the distance between the plurality of patch antennas 110a and 110b and the third ground members 135a, 135b, and 135c is 0.15 mm or more. That is, the distance of 0.15 mm is a value that is empirically obtained when a frequency of the RF signal is 28 GHz and a diameter of the patch antenna is 3 mm to 4 mm, and may be varied depending on the frequency of the RF signal, the size of the patch antenna, or whether an additional configuration is included.

The substrate 100 has a structure in which any one or any combination of any two or more of a first layer, a second layer, a second-second layer, a third layer, a fourth layer, a second-fourth layer, a fifth layer, a sixth layer, and a seventh layer, to be described below, are sequentially disposed.

Figure 2:
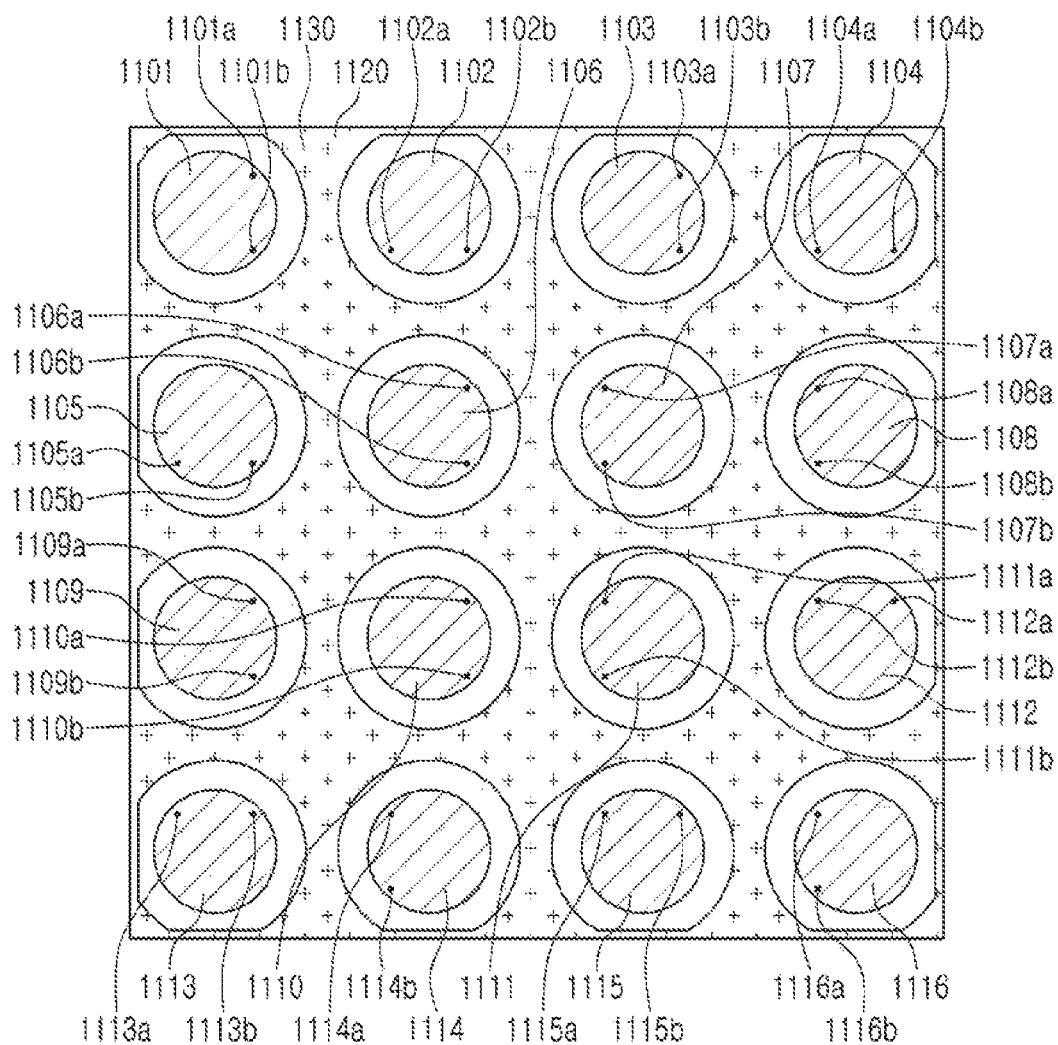
FIG. 2 is a view illustrating a first layer of a substrate of the antenna-integrated RF module in FIG. 1.

FIG. 2 is a view illustrating a first layer of a substrate of the antenna-integrated RF module in FIG. 1.

Referring to FIG. 2, a first layer of the substrate includes a first patch antenna 1101, a second patch antenna 1102, a third patch antenna 1103, a fourth patch antenna 1104, a fifth patch antenna 1105, a sixth patch antenna 1106, a seventh patch antenna 1107, an eighth patch antenna 1108, a ninth patch antenna 1109, a tenth patch antenna 1110, an eleventh patch antenna 1111, a twelfth patch antenna 1112, a thirteenth patch antenna 1113, a fourteenth patch antenna 1114, a fifteenth patch antenna 1115, a sixteenth patch antenna 1116, first signal vias 1101a and 1101b, second signal vias 1102a and 1102b, third signal vias 1103a and 1103b, fourth signal vias 1104a and 1104b, fifth signal vias 1105a and 1105b, sixth signal vias 1106a and 1106b, seventh signal vias 1107a and 1107b, eighth signal vias 1108a and 1108b, ninth signal vias 1109a and 1109b, tenth signal vias 1110a and 1110b, eleventh signal vias 1111a and 1111b, twelfth signal vias 1112a and 1112b, thirteenth signal vias 1113a and 1113b, fourteenth signal vias 1114a and 1114b, fifteenth signal vias 1115a and 1115b, sixteenth signal vias 1116a and 1116b, and a first ground member 1120.

The first to sixteenth patch antennas 1101 to 1116 are arranged in a 4×4 matrix, and each have a circular form. The diameter of the circular form is between 3 mm to 4 mm, but is not limited thereto.

The first to sixteenth signal vias 1101a to 1116b are connected to the first to sixteenth patch antennas 1101 to 1116, respectively, and each passes a transmission signal and a reception signal. That is, each of the first to sixteenth patch antennas 1101 to 1116 are connected to two signal vias.

Positions of the first to sixteenth signal vias 1101a to 1116b are close to edges of the first to sixteenth patch antennas 1101 to 1116, respectively. The orientations of some of the signal vias of adjacent patch antennas in the periphery of the ground member form a right angle. Accordingly, interference between transmission signals and reception signals in each of the first to sixteenth patch antennas 1101 and 1116 is reduced.

In addition, the orientations of the sixth signal vias 1106a and 1106b and the seventh signal vias 1107a and 1107b are disposed parallel to each other. The orientations of tenth signal vias 1110a and 1110b and the eleventh signal vias 1111a and 1111b are disposed parallel to each other. Accordingly, the movement path of the RF signal from the IC to the patch antenna is shortened.

One of the first signal vias 1101a and 1101b is disposed at a position closer to the center of the first layer. The second signal vias 1102a and 1102b are disposed at the position closer to the center of the first layer. One of the third signal vias 1103a and 1103b is disposed at the position closer to the center of the first layer. One of the fourth signal vias 1104a and 1104b is disposed at the position closer to the center of the first layer. One of the fifth signal vias 1105a and 1105b is disposed at the position closer to the center of the first layer. The eighth signal vias 1108a and 1108b are disposed at the position closer to the center of the first layer. The ninth signal vias 1109a and 1109b are disposed at the position closer to the center of the first layer. One of the twelfth signal vias 1112a and 1112b is disposed at the position closer to the center of the first layer. One of the thirteen signal vias 1113a and 1113b is disposed at the position closer to the center of the first layer. One of the fourteenth signal vias 1114a and 1114b is disposed at the position closer to the center of the first layer. The fifteenth signal vias 1115a and 1115b are disposed at the position closer to the center of the first layer. One of the sixteenth signal vias 1116a and 1116b is disposed at the position closer to the center of the first layer.

That is, one of the signal vias of the eight patch antennas (1101, 1103, 1104, 1112, 1116, 1114, 1113, and 1105) at the periphery of the first ground member 1120 are disposed closer to the center of the first ground member 1120, and the other signal via away from the center. Both signal vias of the remaining patch antennas (1102, 1108, 1115, 1109, 1106, 1107, 1110, and 1111) are disposed closer to the center. Four patch antennas adjacent to vertexes among the first to sixteenth patch antennas 1101 to 1116 may include the signal vias all close to the center. Accordingly, the movement path of the RF signal from the IC to the patch antenna is shortened, and the margin of space required for reducing interference of the RF signal is secured.

The first ground member 1120 has sixteen penetration regions corresponding to the arrangement of the first to sixteenth patch antennas 1101 to 1116 so as to be spaced apart each from the other by a predetermined distance.

Depending on design, some of the first to sixteenth patch antennas 1101 to 1116 may be omitted. For example, the first to sixteenth patch antennas 1101 to 1116 may be formed of fourth patch antennas.

Figure 3:
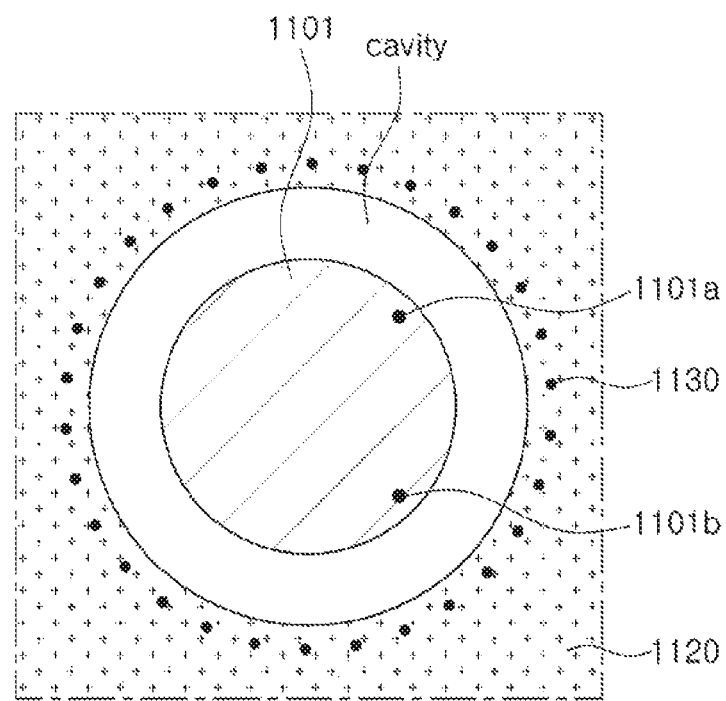
FIG. 3 is a view illustrating a ground via group of the first layer of the substrate in FIG. 2.

FIG. 3 is a view illustrating a ground via group of a portion of the first layer of the substrate in FIG. 1.

Referring to FIG. 3, a first ground via group 1130 is connected to the first ground member 1120 and surrounds the sixteen penetration regions. Accordingly, radiation characteristics of the first to sixteenth patch antennas is improved, and a space between the first to sixteenth patch antennas and the third ground member has a three-dimensional shape.

The sixteen penetration regions may be filled with a non-conductive material.

Figure 4:
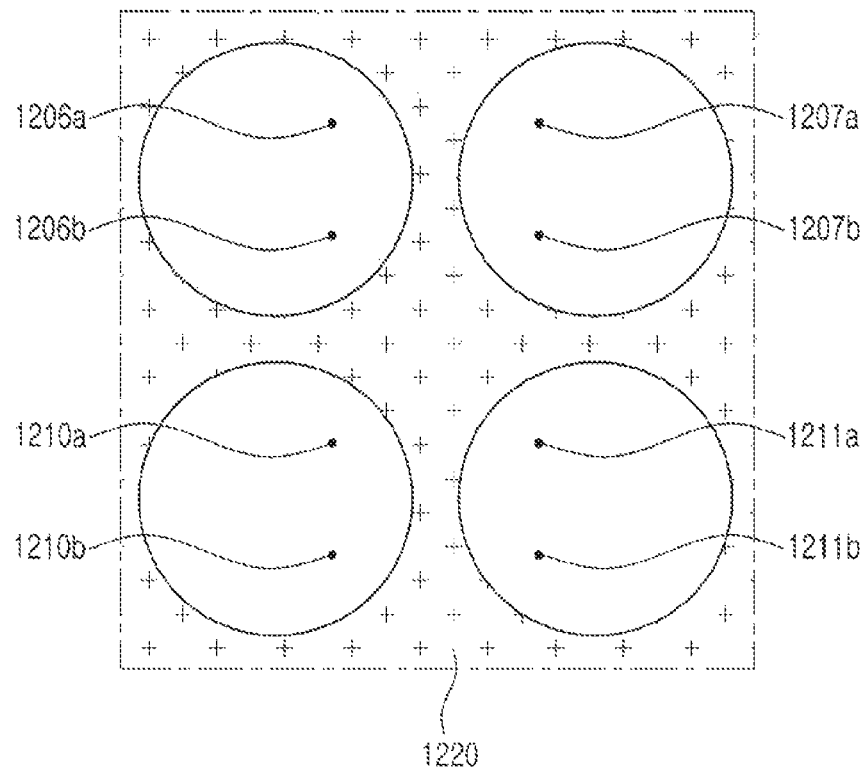
FIG. 4 is a view illustrating a central region of a second layer of the substrate of the antenna-integrated RF module in FIG. 1.

FIG. 4 is a view illustrating a central region of a second layer of the substrate.

Referring to FIG. 4, the central region of the second layer of the substrate includes sixth signal vias 1206a and 1206b, seventh signal vias 1207a and 1207b, tenth signal vias 1210a and 1210b, eleventh signal vias 1211a and 1211b, and a second ground member 1220.

The second layer of the substrate may include a first signal via, a second signal via, a third signal via, a fourth signal via, a fifth signal via, sixth signal vias 1206a and 1206b, seventh signal vias 1207a and 1207b, an eighth signal via, a ninth signal via, tenth signal vias 1210a and 1210b, eleventh signal vias 1211a and 1211b, a twelfth signal via, a thirteenth signal via, a fourteenth signal via, a fifteenth signal via, a sixteenth signal via, and a second ground member 1220.

The first to sixteenth signal vias are connected to the first to sixteenth signal vias disposed on the first layer of the substrate and are disposed at the first to sixteenth penetration regions to pass one of the transmission signal and the reception signal.

The second ground member 1220 surrounds the first to sixteenth signal vias, respectively.

Figure 5:
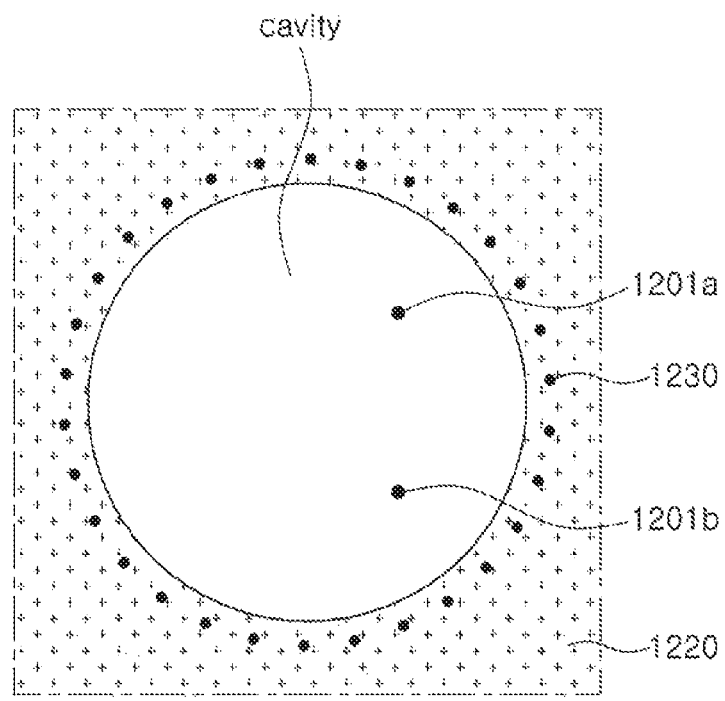
FIG. 5 is a view illustrating a ground via group of the second layer of the substrate in FIG. 4.

FIG. 5 is a view illustrating a ground via group of a portion of the second layer of the substrate.

Referring to FIG. 5, a second ground via group 1230 is connected to the second ground member 1220 and surrounds the sixteen penetration regions, which improves the radiation characteristics of the first to sixteenth patch antennas. A space between the first to sixteenth patch antennas and the third ground member has a three-dimensional shape.

Figure 6:
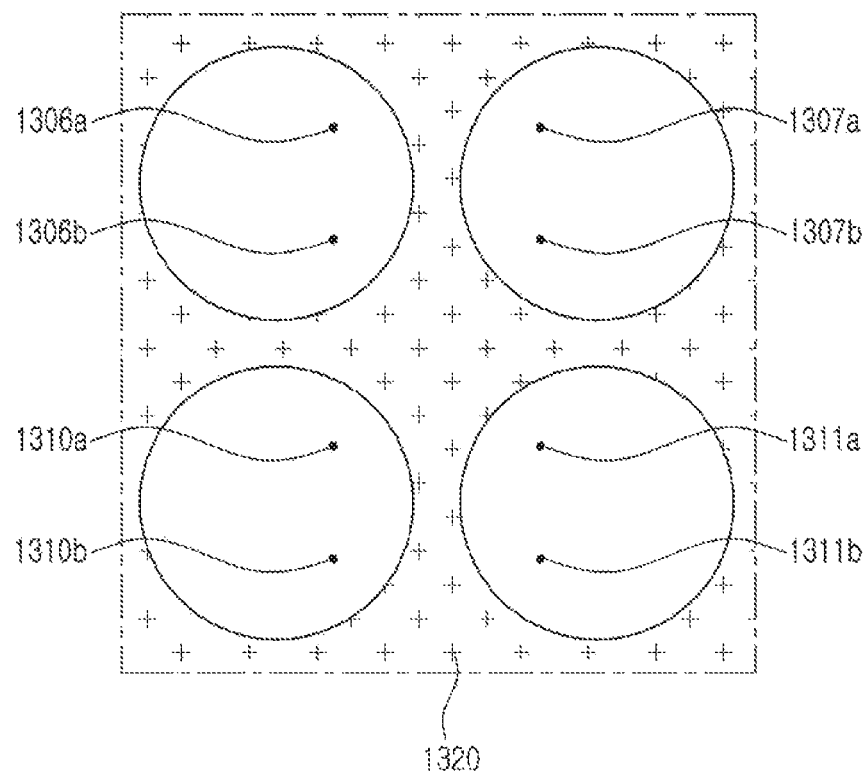
FIG. 6 is a view illustrating a central region of a second-second layer of the substrate of the antenna-integrated RF module in FIG. 1.

FIG. 6 is a view illustrating a central region of a second-second layer of the substrate.

Referring to FIG. 6, the central region of the second-second layer of the substrate includes sixth signal vias 1306a and 1306b, seventh signal vias 1307a and 1307b, tenth signal vias 1310a and 1310b, eleventh signal vias 1311a and 1311b, and a second-second ground member 1320.

The second-second layer of the substrate may include a first signal via, a second signal via, a third signal via, a fourth signal via, a fifth signal via, sixth signal vias 1306a and 1306b, seventh signal vias 1307a and 1307b, an eighth signal via, a ninth signal via, tenth signal vias 1310a and 1310b, eleventh signal vias 1311a and 1311b, a twelfth signal via, a thirteenth signal via, a fourteenth signal via, a fifteenth signal via, a sixteenth signal via, and a second-second ground member 1320.

The first to sixteenth signal vias are connected to the first to sixteenth signal vias disposed on the second layer of the substrate, and are disposed at the first to sixteenth penetration regions to pass one of the transmission signal and the reception signal.

The second-second ground member 1320 has a plurality of penetration regions surrounding the first to sixteenth signal vias, respectively, and includes a second-second ground via group surrounding the plurality of penetration regions, respectively. Accordingly, radiation characteristics of the first to sixteenth patch antennas is improved. A space between the first to sixteenth patch antennas and the third ground member has a more three-dimensional shape.

In addition, since the second-second ground member 1320 extends a spaced distance between the first to sixteenth patch antennas and the third ground member, the second-second ground member 1320 improves radiation characteristics of the first to sixteenth patch antennas.

Figure 7:
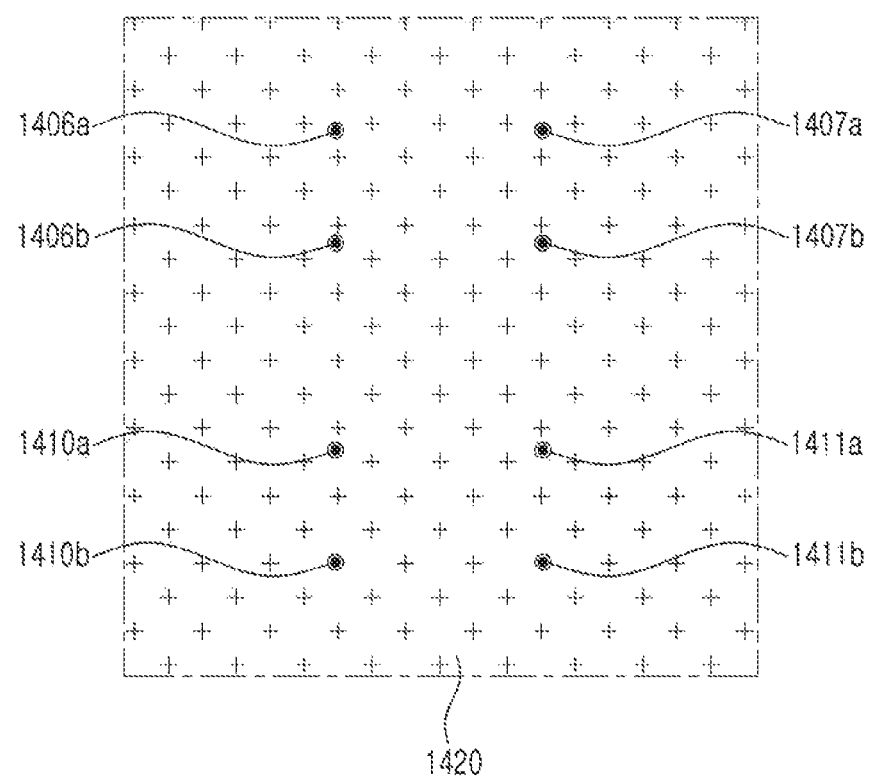
FIG. 7 is a view illustrating a central region of a third layer of the substrate of the antenna-integrated RF module in FIG. 1.

FIG. 7 is a view illustrating a central region of a third layer of the substrate.

Referring to FIG. 7, the central region of the third layer of the substrate includes sixth signal vias 1406a and 1406b, seventh signal vias 1407a and 1407b, tenth signal vias 1410a and 1410b, eleventh signal vias 1411a and 1411b, and a third ground member 1420.

The third layer of the substrate may include a first signal via, a second signal via, a third signal via, a fourth signal via, a fifth signal via, sixth signal vias 1406a and 1406b, seventh signal vias 1407*a* and 1407*b*, an eighth signal via, a ninth signal via, tenth signal vias 1410*a* and 1410*b*, eleventh signal vias 1411*a* and 1411*b*, a twelfth signal via, a thirteenth signal via, a fourteenth signal via, a fifteenth signal via, a sixteenth signal via, and a third ground member 1420.

The first to sixteenth signal vias are connected to the first to sixteenth signal vias disposed on the second-second layer of the substrate and pass one of the transmission signal and the reception signal.

The third ground member 1420 is disposed on almost all regions except for the positions of the first to sixteenth signal vias in the third layer of the substrate. That is, the third ground member 1420 is also disposed at regions corresponding to the positions of the first to sixteenth patch antennas.

The third ground member 1420 reduces electromagnetic influence of the first to sixteenth patch antennas on fourth to seventh layers of the substrate during a radiation operation, and also provides a distance between the third ground member 1420 and the first to sixteenth patch antennas.

In addition, the third ground member 1420 has a plurality of penetration regions surrounding the first to sixteenth signal vias, respectively, and includes a third ground via group surrounding the plurality of penetration regions, respectively.

The third ground via group surrounds the regions corresponding to the positions of the first to sixteenth patch antennas. Accordingly, radiation characteristics of the first to sixteenth patch antennas is improved. The space between the first to sixteenth patch antennas and the third ground member may have a more three-dimensional shape.

In addition, the third ground via group also surround regions corresponding to RF lines disposed on the fourth layer of the substrate. Accordingly, interference of the first to sixteenth patch antennas with the RF lines in the radiation operation is reduced.

Figure 8:
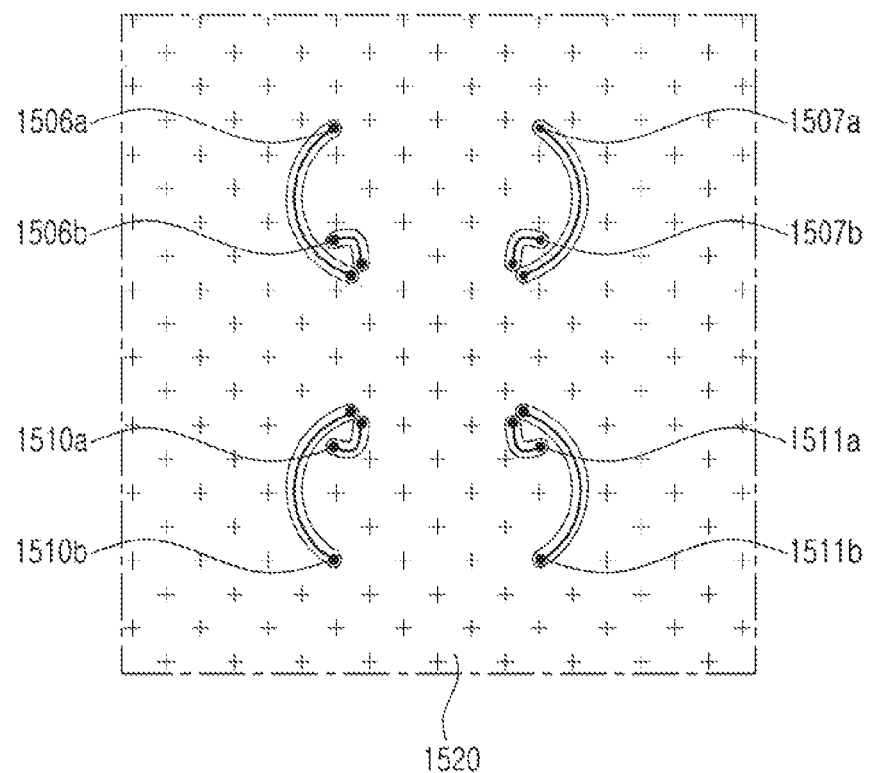
FIG. 8 is a view illustrating a central region of a fourth layer of the substrate of the antenna-integrated RF module in FIG. 1.

FIG. 8 is a view illustrating a central region of a fourth layer of the substrate.

Referring to FIG. 8, the central region of the fourth layer of the substrate includes sixth RF lines 1506*a* and 1506*b*, seventh RF lines 1507*a* and 1507*b*, tenth RF lines 1510*a* and 1510*b*, eleventh RF lines 1511*a* and 1511*b*, and a fourth ground member 1520.

The fourth layer of the substrate may include a first RF line, a second RF line, a third RF line, a fourth RF line, a fifth RF line, sixth RF lines 1506*a* and 1506*b*, seventh RF lines 1507*a* and 1507*b*, an eighth RF line, a ninth RF line, tenth RF lines 1510*a* and 1510*b*, eleventh RF lines 1511*a* and 1511*b*, a twelfth RF line, a thirteenth RF line, a fourteenth RF line, a fifteenth RF line, a sixteenth RF line, and a fourth ground member 1520.

The first to sixteenth RF lines are connected to the first to sixteenth signal vias disposed on the third layer of the substrate and pass one of the transmission signal and the reception signal.

The first to sixteenth RF lines concentrate or disperse RF signals from the central regions in the regions corresponding to the positions of the first to sixteenth patch antennas.

Figure 9:
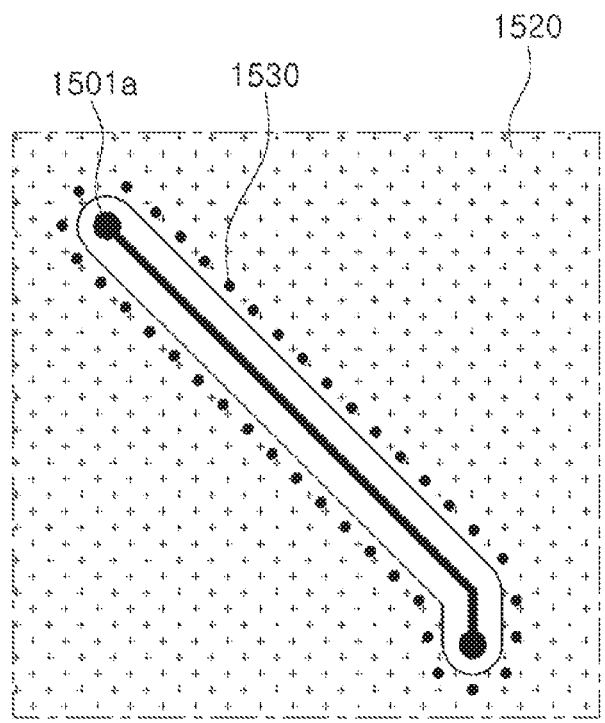
FIG. 9 is a view illustrating a ground via group of the fourth layer of the substrate in FIG. 8.

FIG. 9 is a view illustrating a ground via group of the fourth layer of the substrate.

Referring to FIG. 9, a first RF line 1501*a* is designed to reduce loss of the RF signals by reducing the electrical distance between the first signal via disposed on the third layer and a first signal via disposed on a fifth layer of the substrate, and to reduce interference to the RF signals by securing an arrangement space of the fourth ground via group 1530. The positions of the first to sixteenth signal vias disposed on the first to third layers of the substrate are determined in terms of significantly reducing lengths of the first to sixteenth RF lines and securing the arrangement space of the fourth ground via group 1530.

In addition, the fourth ground via group 1530 surrounds the first to sixteenth RF lines, respectively. Accordingly, interference of the first to sixteenth patch antennas with the RF lines in the radiation operation is reduced.

Figure 10:
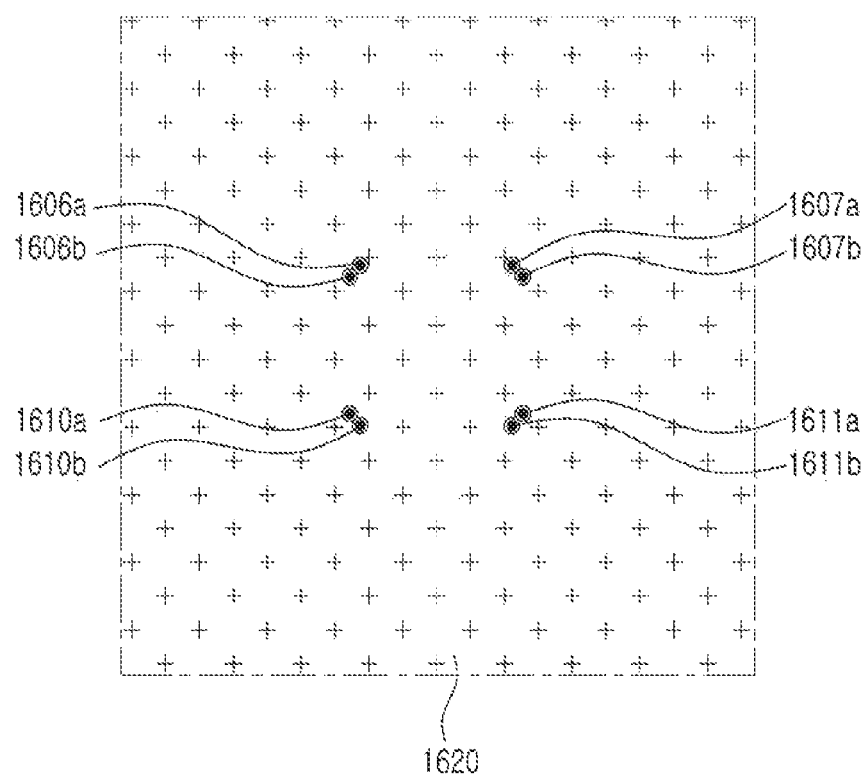
FIG. 10 is a view illustrating a central region of a second-fourth layer of the substrate of the antenna-integrated RF module in FIG. 1.

FIG. 10 is a view illustrating a central region of a second-fourth layer of the substrate.

Referring to FIG. 10, the central region of the second-fourth layer of the substrate includes sixth signal vias 1606*a* and 1606*b*, seventh signal vias 1607*a* and 1607*b*, tenth signal vias 1610*a* and 1610*b*, eleventh signal vias 1611*a* and 1611*b*, and a second-fourth ground member 1620.

The second-fourth layer of the substrate may include a first signal via, a second signal via, a third signal via, a fourth signal via, a fifth signal via, sixth signal vias 1606*a* and 1606*b*, seventh signal vias 1607*a* and 1607*b*, an eighth signal via, a ninth signal via, tenth signal vias 1610*a* and 1610*b*, eleventh signal vias 1611*a* and 1611*b*, a twelfth signal via, a thirteenth signal via, a fourteenth signal via, a fifteenth signal via, a sixteenth signal via, and a second-fourth ground member 1620.

The first to sixteenth signal vias are connected to the first to sixteenth RF lines disposed on the fourth layer of the substrate and pass one of the transmission signal and the reception signal.

The second-fourth ground member 1620 has a plurality of penetration regions surrounding the first to sixteenth signal vias, respectively, and surrounds the regions corresponding to the RF lines disposed on the fourth layer of the substrate. Accordingly, interference to the RF lines is reduced.

Figure 11:
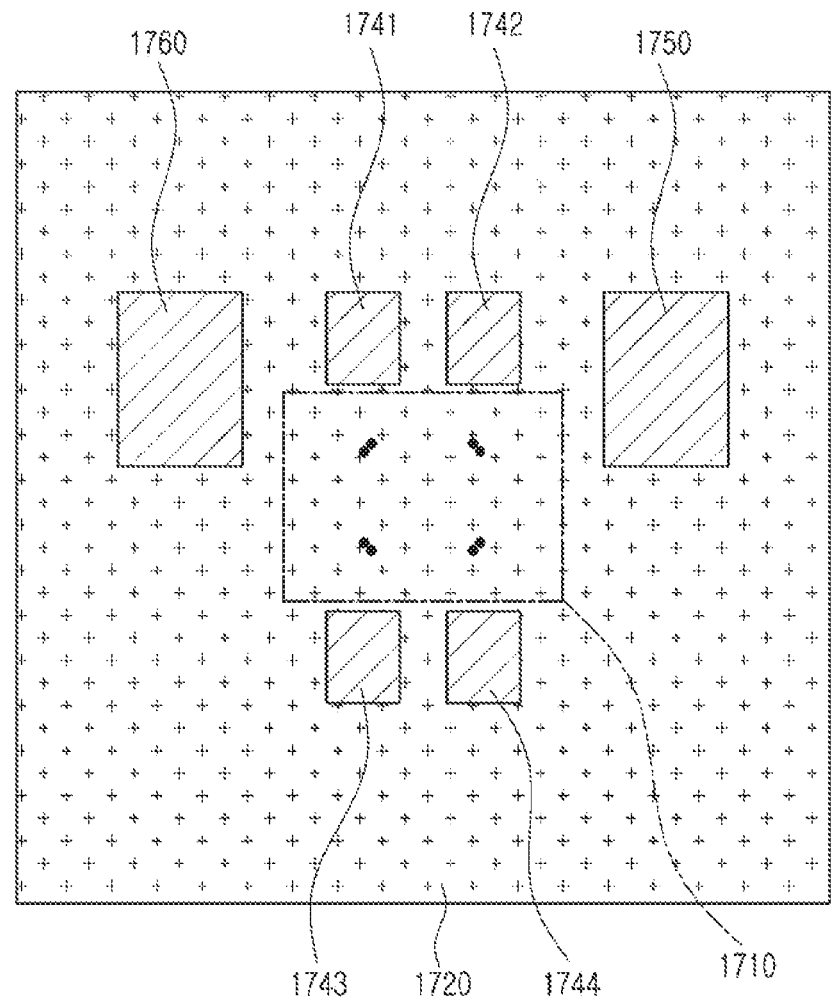
FIG. 11 is a view illustrating a fifth layer of the substrate of the antenna-integrated RF module in FIG. 1.

FIG. 11 is a view illustrating a fifth layer of the substrate in FIG. 1.

Referring to FIG. 11, the fifth layer of the substrate includes a signal via region 1710, a fifth ground member 1720, a first power member 1741, a second power member 1742, a third power member 1743, a fourth power member 1744, a first analog ground member 1750, and a fifth power ground member 1760.

The signal via region 1710 includes a plurality of signal vias connected to the first to sixteenth signal vias disposed on the second-fourth layer of the substrate. The signal via region 1710 corresponds to an arrangement region of the IC.

The first, second, third, and fourth power members 1741, 1742, 1743, and 1744 provide power, and are disposed on a region corresponding to a region on which passive elements are disposed, of a surface of the substrate on which the IC is disposed. Accordingly, the first, second, third, and fourth power members 1741, 1742, 1743, and 1744 provide stable power to the IC.

The first analog ground member 1750 is electrically disconnected from the fifth ground member 1720, and reduces electromagnetic influence of an analog line of a sixth layer of the substrate on the power and the RF signals.

The fifth power ground member 1760 is electrically disconnected from the fifth ground member 1720, and protects some of the lines connected to the first, second, third, and fourth power members 1741, 1742, 1743, and 1744 from the RF signals.

That is, the antenna-integrated RF module according to an example reduces interference between the RF signals and the power, and an analog signal by having a structure in which a plurality of ground regions, electrically disconnected from each other, are disposed together on one layer.

Figure 12:
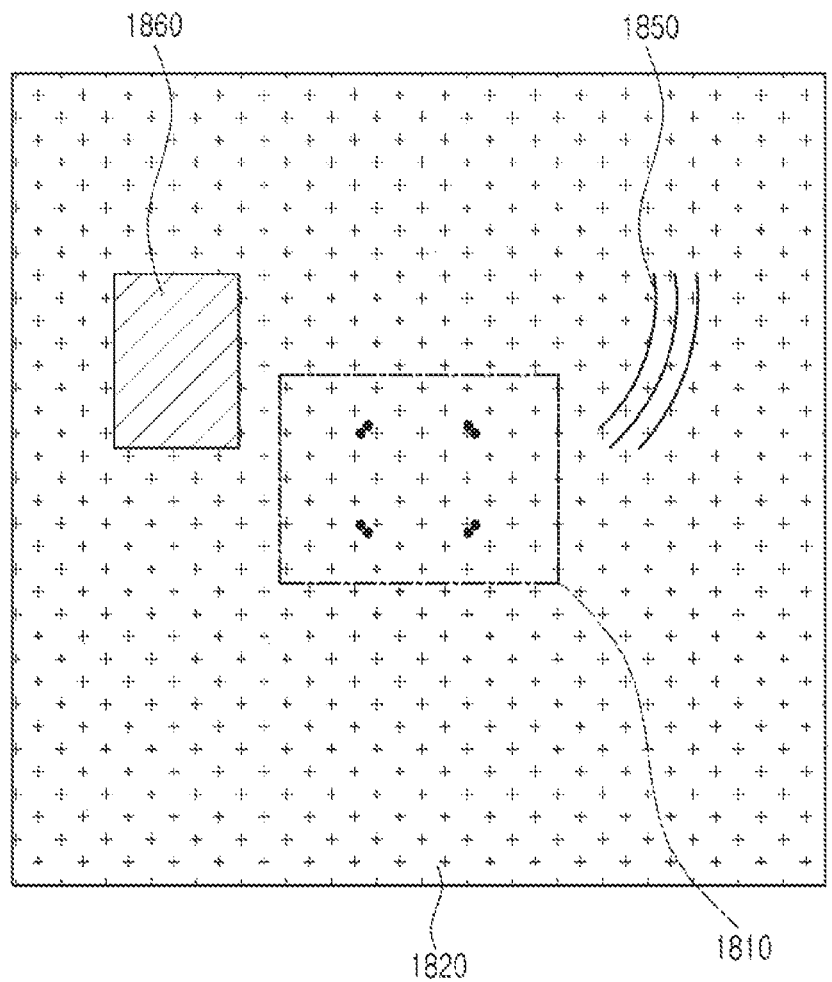
FIG. 12 is a view illustrating a sixth layer of the substrate of the antenna-integrated RF module in FIG. 1.

FIG. 12 is a view illustrating a sixth layer of the substrate.

Referring to FIG. 12, a sixth layer of the substrate includes a signal via region 1810, a sixth ground member 1820, an analog line 1850, and a sixth power ground member 1860.

The signal via region 1810 includes a plurality of signal vias connected to the first to sixteenth signal vias disposed on the fifth layer of the substrate. The signal via region 1810 corresponds to an arrangement region of the IC.

The analog line 1850 is electrically disconnected from the sixth ground member 1820, and disposed between the first and second analog ground members. Accordingly, electromagnetic influence of the analog line 1850 on the power and the RF signals is reduced. The analog line 1850 is electrically connected to the IC through the analog via, and may pass the analog signal.

The sixth power ground member 1860 is electrically disconnected from the sixth ground member 1820, and reduces an influence of switching noise based on an on-off operation of a semiconductor switch of a DC-DC converter on the power and RF signals. The DC-DC converter may be embedded in the IC or may be disposed outside of the substrate.

Figure 13:
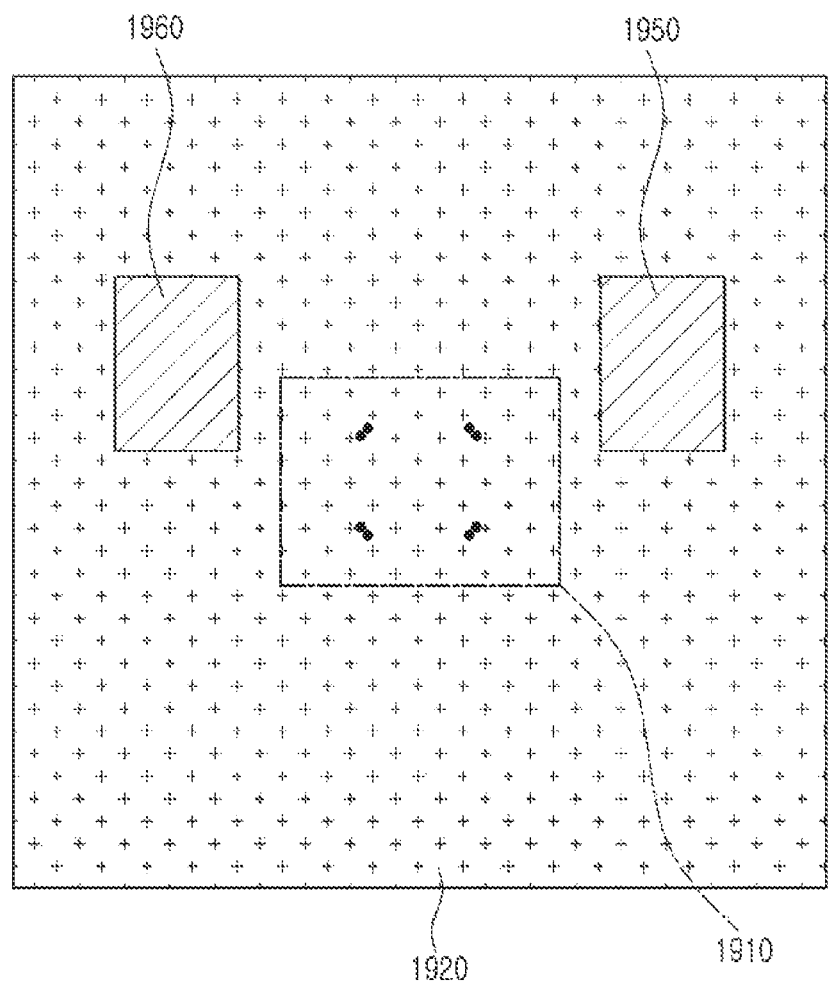
FIG. 13 is a view illustrating a seventh layer of the substrate of the antenna-integrated RF module in FIG. 1.

FIG. 13 is a view illustrating a seventh layer of the substrate.

Referring to FIG. 13, a seventh layer of the substrate includes a signal via region 1910, a seventh ground member 1920, a second analog ground member 1950, and a seventh power ground member 1960.

The signal via region 1910 includes a plurality of signal vias connected to the first to sixteenth signal vias disposed on the sixth layer of the substrate. The signal via region 1910 may correspond to an arrangement region of the IC.

The second analog ground member 1950 is electrically disconnected from the seventh ground member 1920, and reduces electromagnetic influence of the analog line of the sixth layer of the substrate on the power and the RF signals.

The seventh power ground member 1960 is electrically disconnected from the seventh ground member 1920, and reduces an influence of switching noise due to the on-off operation of the semiconductor switch of a DC-DC converter on the power and RF signals.

Figure 14:
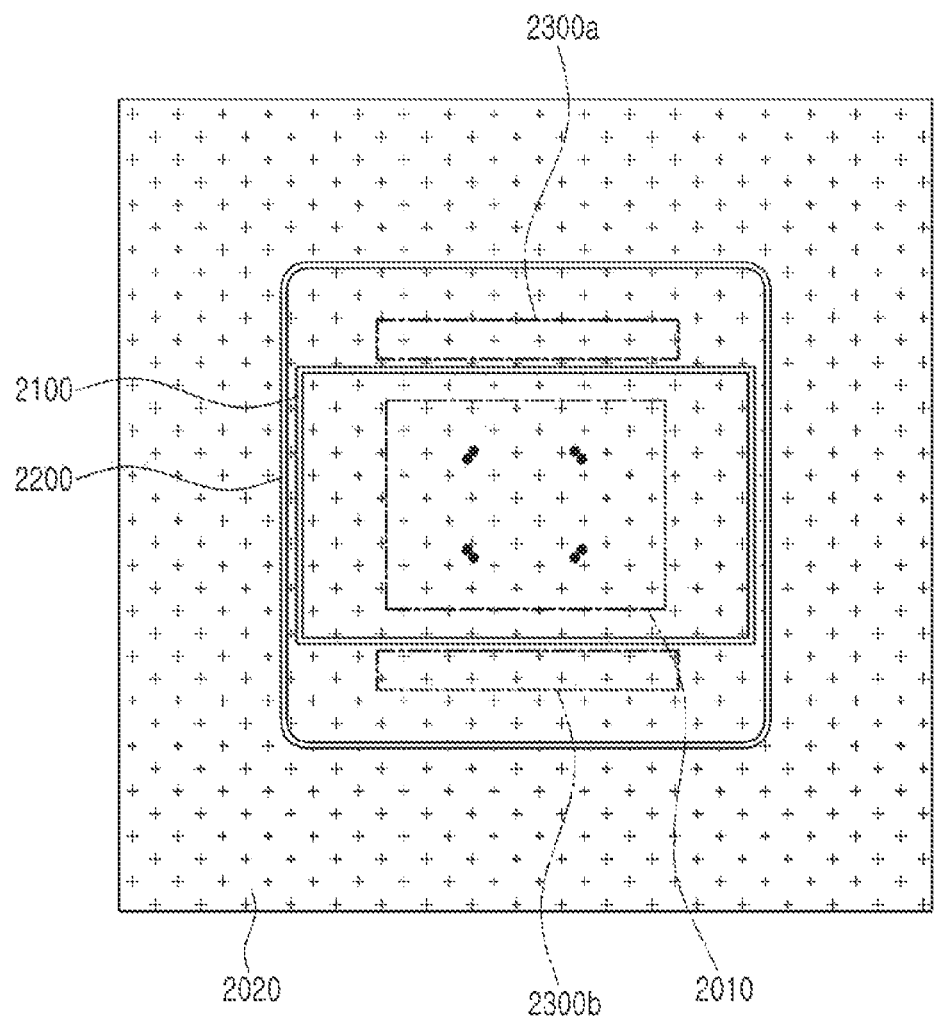
FIG. 14 is a view illustrating a surface of the substrate in FIG. 1 on which an IC is disposed.

FIG. 14 is a view illustrating a surface of the substrate on which an IC is disposed.

Referring to FIG. 14, a surface of the substrate on which the IC is disposed includes a signal via region 2010, an eighth ground member 2020, a first trench 2100, a second trench 2200, and passive elements 2300*a* and 2300*b*.

The signal via region 2010 includes a plurality of signal vias connected to the first to sixteenth signal vias disposed on the seventh layer of the substrate, and may provide an arrangement space of the IC.

The first trench 2100 is disposed to surround the signal via region 2010. The first trench 2100 reduces a negative influence of an adhesive solution used in an operation of bonding the IC to the substrate on the passive elements 2300*a* and 2300*b*.

The second trench 2200 is disposed to surround the passive elements 2300*a* and 2300*b*. The second trench 2200 reduces a negative influence of the adhesive solution used in an operation of bonding a sub-substrate to the substrate on the passive elements 2300*a* and 2300*b*.

The passive elements 2300*a* and 2300*b* provide capacitance to the power supply and the ground of the substrate, and include a multilayer ceramic capacitor (MLCC).

The surface of the substrate on which the IC is disposed may further include a plurality of external terminals electrically connected to the sub-substrate. That is, the plurality of external terminals may receive a predetermined voltage, power, or signal from the outside of the substrate. The plurality of external terminals may be electrically connected to the IC, and may be electrically connected to the analog line, the power member, and/or the power ground member.

Figure 15:
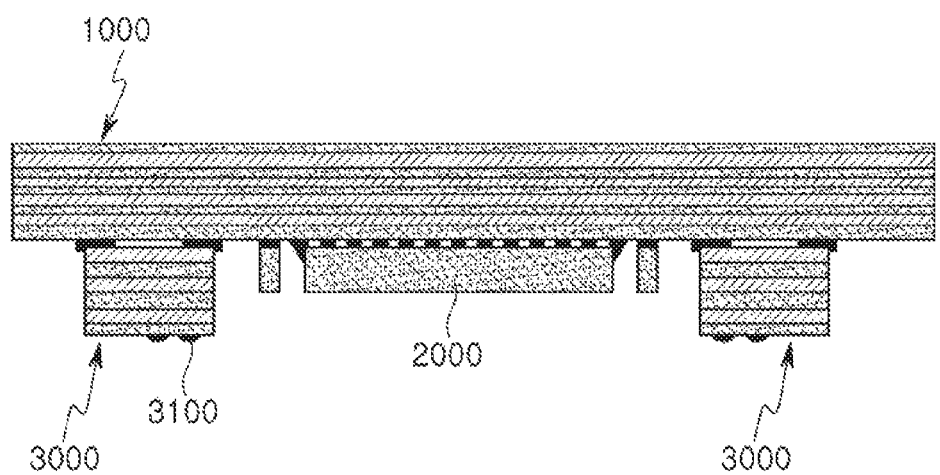
FIG. 15 is a view illustrating an arrangement of a sub-substrate.

FIG. 15 is a view illustrating an arrangement of a sub-substrate.

Referring to FIG. 15, an antenna-integrated RF module according to an example includes a substrate 1000, an IC 2000, and sub-substrates 3000.

A horizontal length and a vertical length of the substrate 1000 are each be 21.4 mm, but are not limited thereto.

The IC 2000 generates and processes an RF signal having a frequency of several tens to several hundred GHz.

The sub-substrate 3000 has a height greater than a height of the IC 2000 to protect the IC 2000 from external impact, and is electrically connected to the substrate 1000 through solder balls 3100 to be supplied by external power or signal to the substrate 1000 and the IC 2000.

In addition, a molding may be disposed between the sub-substrates 3000 to protect the IC 2000.

As set forth above, according to the examples in the present disclosure, the antenna-integrated RF module prevents deterioration in radiation characteristics and signal transmission efficiency of the antenna due to a reduction in size when reducing the overall size by integrating the operating environment from the integrated chip (IC) with the antenna, and may reduce loss and interference in the case in which the signals of the frequency of several tens to several hundred GHz are transmitted between the IC and the antenna.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna-integrated radio frequency (RF) module, comprising:
    a multilayer substrate;
    an integrated chip (IC) disposed on an outer surface of the multilayer substrate;
    an RF line disposed on a layer of the multilayer substrate;
    an IC signal via electrically connected between the IC and the RF line;
    an antenna disposed on an antenna layer of the multilayer substrate;
    a first antenna ground member comprising an antenna penetration region surrounding the antenna;
    a first intermediate ground member comprising a first via penetration region;
    a second intermediate ground member surrounding the RF line;

an antenna signal via electrically connected to the RF line, and disposed to penetrate the first via penetration region; and ground vias electrically connected to at least one of the first and second intermediate ground members, and disposed surrounding the RF line.

2. The antenna-integrated RF module of claim 1,
wherein the antenna penetration region is larger than the first via penetration region.

3. The antenna-integrated RF module of claim 1, further comprising first antenna ground vias electrically connected between the first antenna ground member and the first intermediate ground member, and disposed around a boundary of the first antenna penetration region.

4. The antenna-integrated RF module of claim 1, further comprising a second antenna ground member disposed between the first antenna ground member and the first intermediate ground member, and comprising a second via penetration region surrounding the antenna signal via.

5. The antenna-integrated RF module of claim 4, further comprising second antenna ground vias electrically connected between the second antenna ground member and the first intermediate ground member, and disposed around a boundary of the second via penetration region.

6. The antenna-integrated RF module of claim 5, further comprising a third antenna ground member disposed between the first antenna ground member and the second antenna ground member, and comprising a third via penetration region surrounding the antenna signal via.

7. The antenna-integrated RF module of claim 6, further comprising third antenna ground vias electrically connected between the second antenna ground member and the third antenna ground member, and disposed around a boundary of the third via penetration region.

8. The antenna-integrated RF module of claim 7,
wherein the second via penetration region is larger than the first via penetration region, and
wherein the third via penetration region is larger than the first via penetration region.

9. The antenna-integrated RF module of claim 1, further comprising an IC ground member comprising an IC via penetration region surrounding the IC signal via.

10. The antenna-integrated RF module of claim 1,
wherein a distance between the antenna and the first intermediate ground member is greater than a distance between the first intermediate ground member and the second intermediate ground member.

11. The antenna-integrated RF module of claim 1,
wherein the antenna signal via comprises a first antenna signal via and a second antenna signal via electrically connecting to the antenna,
wherein a first connection point of the antenna to the first antenna signal via is biased from a center of the antenna in a first direction, and
wherein a second connection point of the antenna to the second antenna signal via is biased from the center of the antenna in a second direction which is perpendicular to the first direction.

12. The antenna-integrated RF module of claim 1, wherein the antenna comprises a patch antenna.

13. An antenna-integrated radio frequency (RF) module, comprising:
a multilayer substrate;
an integrated chip (IC) disposed on an outer surface of the multilayer substrate;
RF lines disposed on a line layer of the multilayer substrate;

IC signal vias electrically connected between the IC and the RF lines;
antennas disposed on an antenna layer of the multilayer substrate;
an intermediate ground member comprising first via penetration regions;
a first antenna ground member comprising antenna penetration regions surrounding each of the antennas;
antenna signal vias electrically connected to the RF lines, and disposed to penetrate the first via penetration regions; and
antenna ground vias electrically connected between the first antenna ground member and the intermediate ground member, and disposed around boundaries of the antenna penetration regions.

14. The antenna-integrated RF module of claim 13,
wherein each of the antenna penetration regions is larger than each of the first via penetration regions.

15. The antenna-integrated RF module of claim 14, further comprising a second antenna ground member disposed between the first antenna ground member and the intermediate ground member, and comprising second via penetration regions surrounding each of the antenna signal vias.

16. The antenna-integrated RF module of claim 15, further comprising a third antenna ground member disposed between the first antenna ground member and the second antenna ground member, and comprising third via penetration regions surrounding each of the antenna signal vias.

17. The antenna-integrated RF module of claim 16,
wherein each of the third via penetration regions is larger than each of the first and second via penetration regions.

18. An antenna-integrated radio frequency (RF) module, comprising:
a multilayer substrate;
an IC signal via extending between layers of the multilayer substrate and configured to be connected to an integrated chip (IC);
an RF signal line disposed on a layer of the multilayer substrate comprising a first electrical connection to the IC signal via and a second electrical connection to an antenna signal via spaced apart from the first electrical connection;
an antenna disposed on an antenna layer of the multilayer substrate coupled to the antenna signal via;
a first intermediate ground member comprising a first penetration region and disposed on another layer of the multilayer substrate, wherein the antenna signal via extends through the first penetration region; and
a first ground via group electrically connected to the first intermediate ground member and disposed to surround the first penetration region,
wherein the first intermediate ground member overlaps the first connection and the first penetration region overlaps the second connection in a view perpendicular to the layer.

19. The antenna-integrated RF module of claim 18, further comprising:
an IC disposed on an outer surface of the multilayer substrate electrically connected to the IC signal via.

20. The antenna-integrated RF module of claim 19, further comprising:
a second intermediate ground member disposed on the layer and spaced apart from and surrounding the RF signal line; and
a second ground via group electrically connected to at least one of the first intermediate ground member and the second intermediate ground member and disposed to surround the RF signal line.

21. The antenna-integrated RF module of claim 18, further comprising:
- an antenna ground member comprising a second penetration region surrounding the antenna, wherein the second penetration region is larger than the first penetration region; and
- an antenna ground via group connected between the antenna ground member and the first intermediate ground member, and disposed along boundaries of the first and second penetration regions.

\* \* \* \* \*